(12) United States Patent
Brink

(10) Patent No.: US 10,716,238 B2
(45) Date of Patent: Jul. 14, 2020

(54) DEVICE COMPRISING HEAT PRODUCING COMPONENTS WITH LIQUID SUBMERSION COOLING

(71) Applicant: Aecorsis B.V., Haarlem (NL)

(72) Inventor: Dirk Roelof Brink, Amsterdam (NL)

(73) Assignee: AECORSIS B.V., Haarlem (NL)

(*) Notice: Subject to any disclaimer, the term of this patent is extended or adjusted under 35 U.S.C. 154(b) by 0 days.

(21) Appl. No.: 15/775,281

(22) PCT Filed: Nov. 21, 2016

(86) PCT No.: PCT/EP2016/078344
§ 371 (c)(1),
(2) Date: May 10, 2018

(87) PCT Pub. No.: WO2017/089313
PCT Pub. Date: Jun. 1, 2017

(65) Prior Publication Data
US 2018/0343770 A1 Nov. 29, 2018

(30) Foreign Application Priority Data
Nov. 23, 2015 (NL) .................................. 2015841

(51) Int. Cl.
*H05K 7/20* (2006.01)
*H01L 23/44* (2006.01)
(Continued)

(52) U.S. Cl.
CPC ......... *H05K 7/20236* (2013.01); *F24F 13/15* (2013.01); *G06F 1/20* (2013.01);
(Continued)

(58) Field of Classification Search
CPC .......... H05K 7/20236; H05K 7/20609; H05K 7/20636–20645; H05K 7/20772–20781; H01L 23/44
See application file for complete search history.

(56) References Cited

U.S. PATENT DOCUMENTS 2,886,746 A * 5/1959 Saby .................... F28D 15/0233
165/104.29
3,091,722 A * 5/1963 Rusiniak ................ H05K 5/067
165/104.32
(Continued)

FOREIGN PATENT DOCUMENTS

EP 2487326 A1 * 8/2012 ......... E21B 41/0007
EP 2487327 8/2012
(Continued)

*Primary Examiner* — Robert J Hoffberg
(74) *Attorney, Agent, or Firm* — Marcus C. Dawes

(57) ABSTRACT

A device comprising heat producing electronic components (2), such as server memory boards, processors and/or switches, said device comprising a container (1) wherein said heat producing components are mounted, a liquid in said container in which liquid said components are submerged for extracting heat from said components, at least one heat exchanger (7) having a surface which is in contact with said liquid and arranged to extract heat from said liquid, wherein between said heat exchanger and said components a vertical wall (6) is present for guiding and separating a vertical circulation of said liquid in said container which is caused by a temperature difference in said liquid.

16 Claims, 5 Drawing Sheets

(51) Int. Cl.
   *G06F 1/20* (2006.01)
   *F24F 13/15* (2006.01)

(52) U.S. Cl.
   CPC ......... *H01L 23/44* (2013.01); *H05K 7/20245* (2013.01); *H05K 7/20263* (2013.01); *H05K 7/20636* (2013.01); *H05K 7/20772* (2013.01); *G06F 2200/201* (2013.01)

(56) References Cited

U.S. PATENT DOCUMENTS

| | | | | |
|---|---|---|---|---|
| 3,435,283 A * | 3/1969 | Boissiere | ................ | H01J 19/36 315/32 |
| 3,512,582 A * | 5/1970 | Chu | ...................... | H01L 23/427 165/104.27 |
| 3,626,080 A * | 12/1971 | Pierce | ................... | F28D 15/02 165/104.13 |
| 3,858,090 A * | 12/1974 | Lehmann | ........... | H05K 7/20236 165/104.33 |
| 4,572,286 A * | 2/1986 | Fujii | ..................... | F25B 23/006 165/104.19 |
| 4,653,579 A * | 3/1987 | Fujii | ..................... | F25B 23/006 165/104.21 |
| 4,928,206 A * | 5/1990 | Porter | ................... | H05K 1/189 165/104.33 |
| 6,019,167 A * | 2/2000 | Bishop | ..................... | F28F 1/10 165/104.19 |
| 6,145,584 A * | 11/2000 | Baynes | ................... | F28D 15/02 165/104.19 |
| 6,149,254 A * | 11/2000 | Bretschneider | ........ | H02B 1/565 312/213 |
| 6,279,325 B1 * | 8/2001 | Sekiya | ................... | F02G 1/043 62/520 |
| 6,742,583 B2 * | 6/2004 | Tikka | ..................... | H05K 7/206 165/261 |
| 7,983,041 B2 * | 7/2011 | Godfroy | .................. | H05K 5/06 165/104.33 |
| 9,781,862 B2 * | 10/2017 | Kolstad | ............... | E21B 41/0007 |
| 9,992,914 B2 * | 6/2018 | Best | ................... | H05K 7/20763 |
| 10,123,463 B2 * | 11/2018 | Best | ................... | H05K 7/20763 |
| 10,206,308 B2 * | 2/2019 | De Meijer | ............... | G06F 1/20 |
| 10,568,234 B1 * | 2/2020 | Mao | ................... | H05K 7/20236 |
| 2008/0101779 A1 * | 5/2008 | Wu | ........................ | F24H 3/004 392/346 |
| 2011/0132579 A1 * | 6/2011 | Best | ................... | H05K 7/20763 165/104.31 |
| 2014/0352928 A1 * | 12/2014 | Huang | ................ | H05K 7/20236 165/104.31 |
| 2017/0112021 A1 * | 4/2017 | Gradinger | .......... | H05K 7/20236 |
| 2017/0223870 A1 * | 8/2017 | Smith | ........................ | F25D 3/00 |
| 2017/0280577 A1 * | 9/2017 | Laneryd | ................. | H01F 27/14 |
| 2018/0153058 A1 * | 5/2018 | Hirai | .................. | H05K 7/20236 |

FOREIGN PATENT DOCUMENTS

| | | |
|---|---|---|
| EP | 2803813 | 11/2014 |
| EP | 2846617 | 3/2015 |

* cited by examiner

DEVICE COMPRISING HEAT PRODUCING COMPONENTS WITH LIQUID SUBMERSION COOLING

The invention relates to a device comprising heat producing components, such as server memory boards, hard disks, processors and/or switches, said device comprising a container wherein said heat producing components are mounted, a liquid in said container in which liquid said components are submerged for extracting heat from said components, at least one heat exchanger having a surface which is in contact with said liquid and arranged to extract heat from said liquid. The invention may also be applicable to non-electronic heat producing components.

Submersion cooling of electronic components is a well known technology. Oil, or any other suitable dielectric fluid may be used as a cooling liquid. In order to efficiently cool the components the oil must flow along the components and along a cool heat exchanging surface for transferring the heat from the cooling liquid. Especially in datacentres an energy efficient system of cooling is required.

The invention aims at a more efficient, energy saving, space saving, cost saving, robust and/or maintenance free solution for immersion cooling of heat producing components.

To that end a vertical wall is present between said heat exchanger and said components for guiding and separating a vertical circulation of said liquid in said container which is caused by a temperature difference in said liquid. In this manner a self induced double and symmetrical vertical circulation of the cooling liquid is caused by convection in an efficient way, in which the danger of hot spots is avoided, and there is no need for mechanical driven means for causing the necessary liquid flow in the device. The system is self regulating, in that if the components get hotter, the liquid will flow faster and thereby will cool faster. For interpretation of the feature that seen in a horizontal cross section of said device, said components are disposed between at least two of said heat exchangers and vertical walls, it should be noticed that said at least two of said heat exchangers and/or vertical walls may also be at least two different sections of one continuous heat exchanger and/or vertical wall. Preferably the container has heat insulated walls.

Preferably, seen in a horizontal cross section of said device, said components are disposed between at least two of said heat exchangers and vertical walls. Preferably said components are mounted on a multitude of plate shaped boards, said boards being vertically mounted in said container in a parallel manner between and perpendicular to said at least two vertical walls. Preferably a first space is provided between the lower edges of said walls and the bottom of the container and a second space is provided between the upper edges of said walls and the upper wall of the container, for allowing said liquid circulation to pass. Preferably, seen in a horizontal cross section of said device, said components are disposed between said heat exchangers and vertical walls in a symmetrical configuration.

Preferably said cooling liquid is a dielectric fluid, such as oil, having a sufficiently large coefficient of expansion. Preferably said heat exchangers are radiator type heat exchangers, having ducts through which a cooling liquid such as water flows. Alternatively said heat exchangers may be radiating heat exchangers, comprising cooling fins extending on the other side of said surface being in contact with the liquid.

In a further preferred embodiment, seen in a horizontal cross section of said device, said components are disposed between said heat exchangers and vertical walls in a concentric configuration.

In still further embodiments a multitude of clusters of components are mounted horizontally spaced apart in said container, each cluster being disposed between at least two of said heat exchangers and vertical walls, and wherein at least one of said heat exchangers is disposed between at least two of said walls and clusters.

Preferably said vertical walls are made of a heat insulating material. The inner volume of said container is preferably more than 1 l, more preferably more than 50 l, even more preferably more than 1000 l. The top wall of said container is preferably a removable lid.

The invention will now be illustrated by means of a preferred embodiment, with reference to the drawings, wherein.

Figure 1:
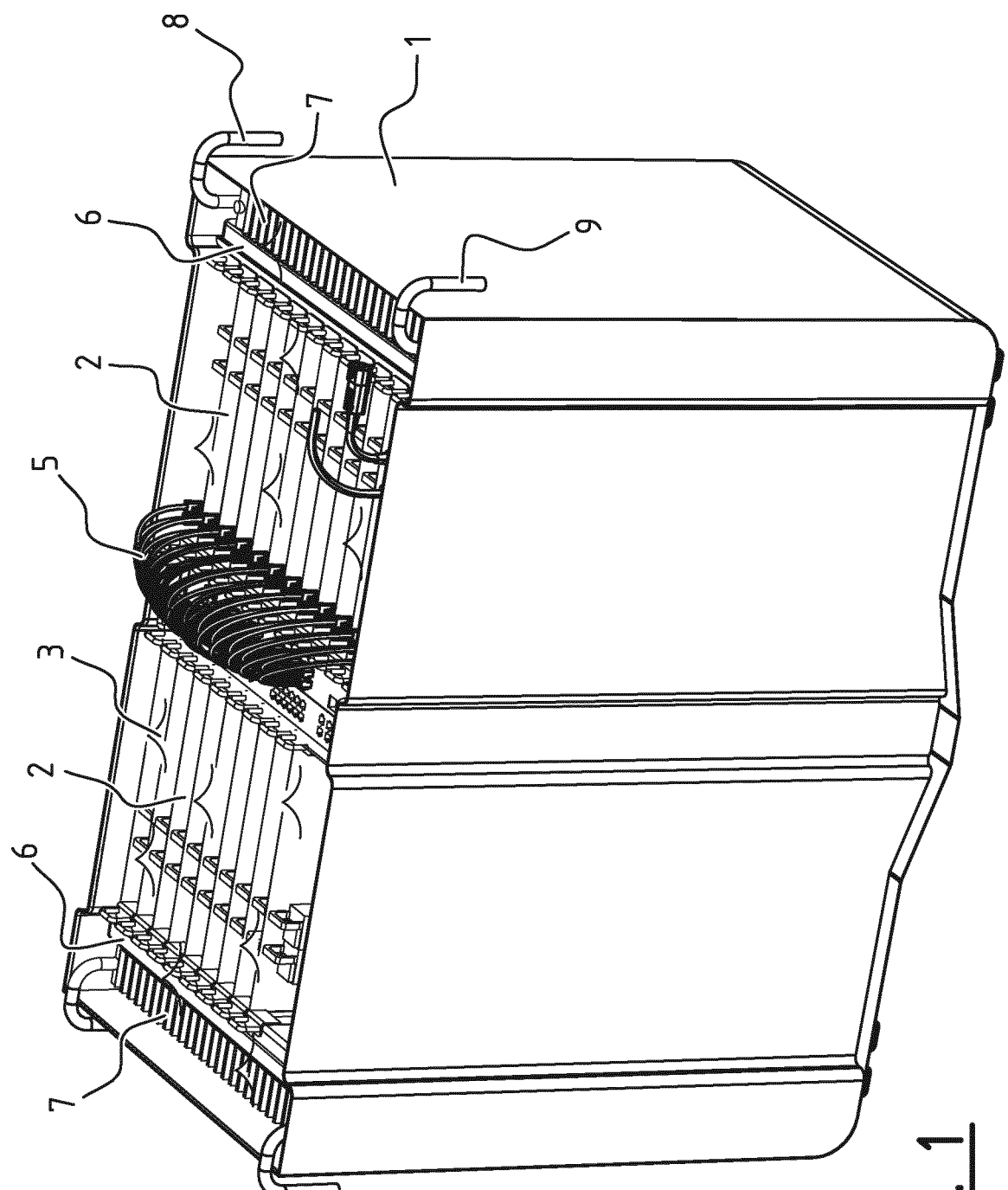
FIG. 1 is a perspective view of a device in accordance with the invention.
Figure 2:
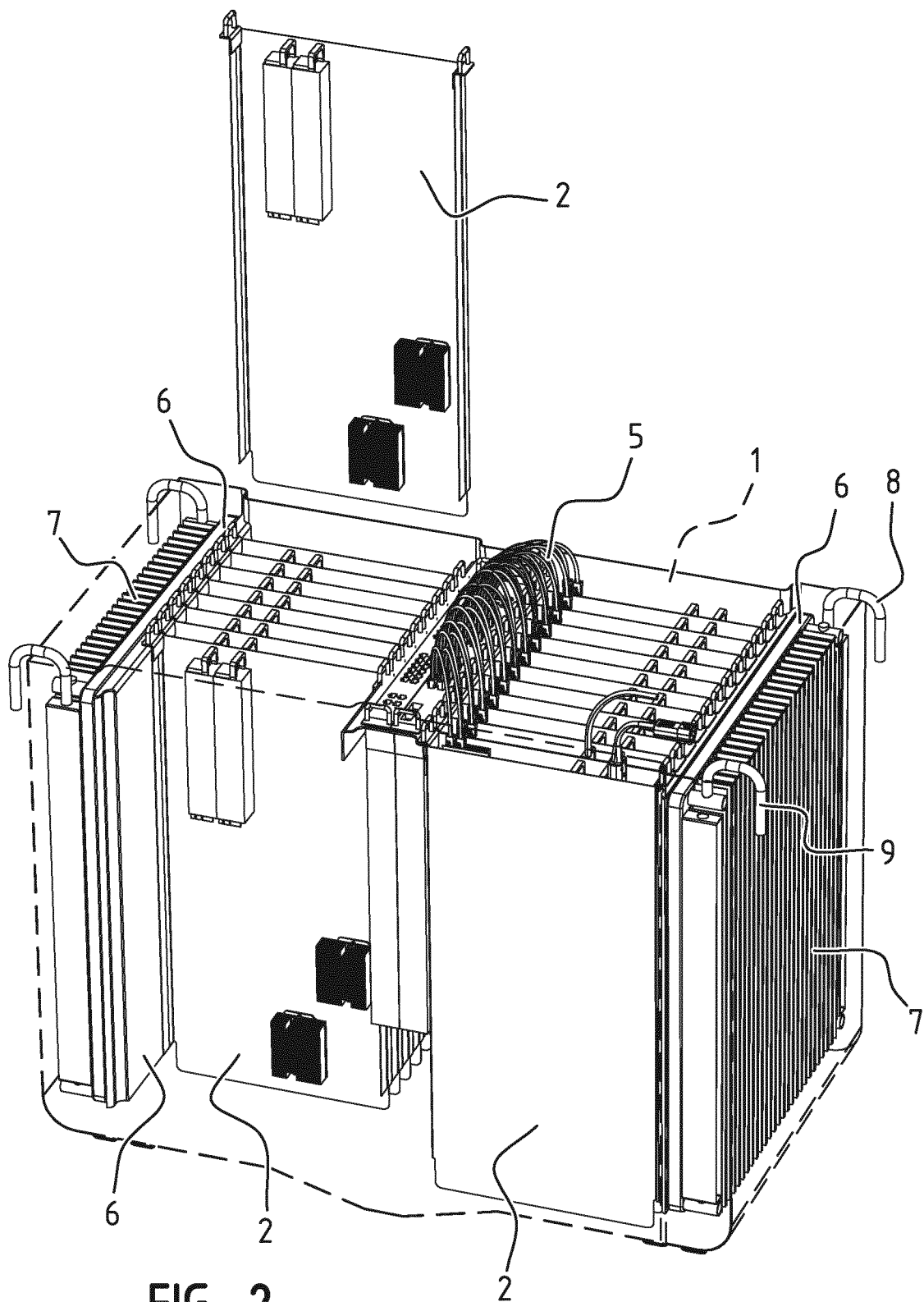
FIG. 2 is a further perspective view of the device of FIG. 1.
Figure 3:
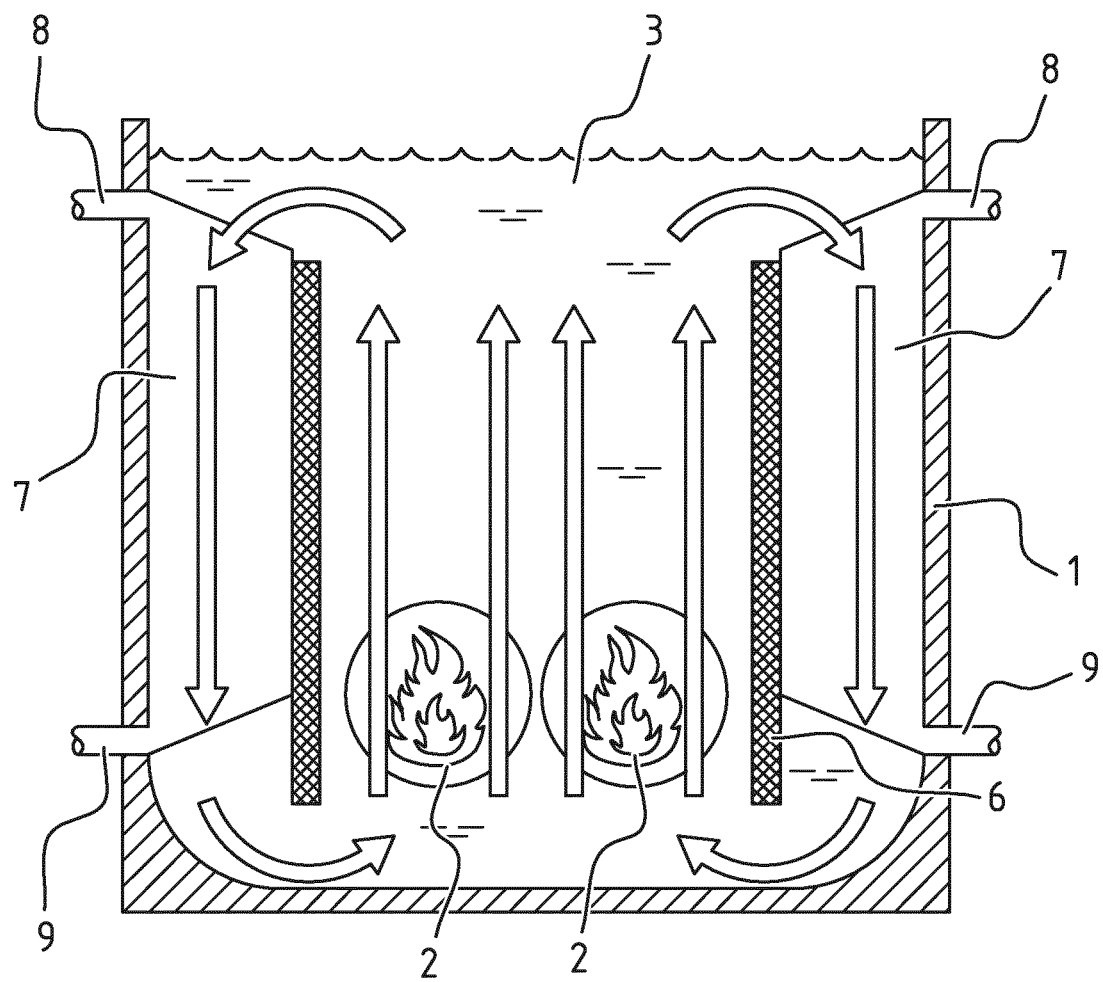
FIG. 3 is a schematic vertical cross section of the device of FIG. 1.

According to FIGS. 1, 2 and 3 the device comprises a liquid tight container 1 in which from the top side two arrays of parallel boards (PCBs) 2 with heat producing electronic components, such as memory chips, processors and switches, are suspended. In use the boards 2 are completely submerged in a suitable oil 3. The top side of the container 1 is closed of by one or more hingeable lids. The boards 2 are connected to the outer side of the container 1 by electrical connecting means 5. On two opposite sides of the two arrays of boards 2 vertical separation walls 6 are mounted in the container 1. The walls 6 extend perpendicular to the boards 2. On the other side of the walls 6 radiator type heat exchangers 7 are mounted in the container 1, which are also submerged in the oil 3. The walls 6 substantially separate the space in which the boards 2 with the electronic components extend and the spaces in which the heat exchanger 7 extend.

As can be seen in FIG. 3, when the electronic components heat up during use of the device, a double and symmetrical vertical circulation of the oil in the container is caused by the temperature difference in the oil 3, wherein the oil 3 rises in the centre of the container 1 between the heated components 2 and descends at the sides of the container 1, at the other side of the walls 6, along the cooling heat exchangers 7. Cooling water is pumped through the conduits of the heat exchangers 7, and supplied to the device through a supply pipe 8 and discharged form the device through a discharge pipe 9. The heat thus extracted may be re-used for other purposes.

Figure 4:
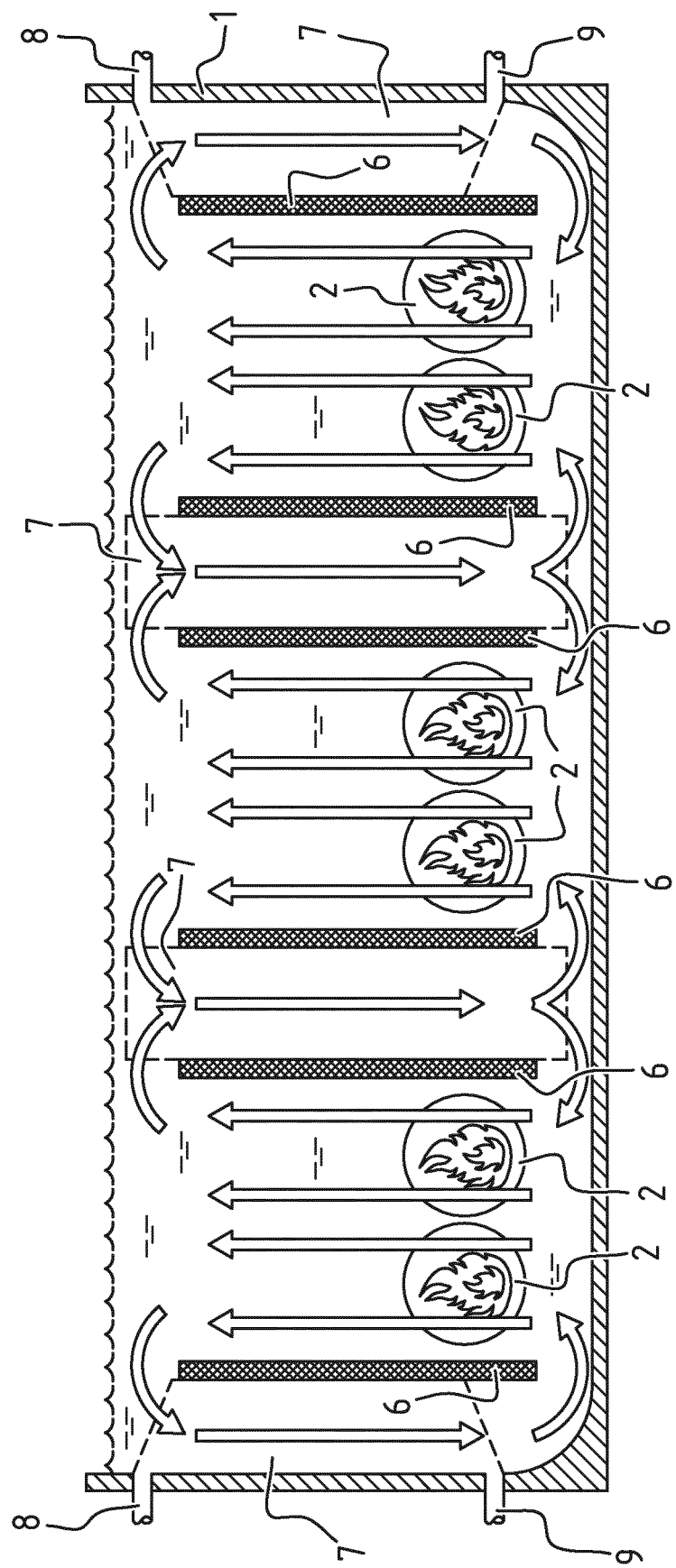
FIG. 4 is a schematic vertical cross section of another embodiment of a device in accordance with the invention.

FIG. 4 shows another embodiment of the device, wherein three clusters of electronic components 2 are mounted in the container 1, spaced apart from each other. Again on two opposite sides of each cluster the vertical separation walls 6 are mounted in the container 1. On the other side of the walls the submerged heat exchangers 7 extend, wherein the heat exchangers 7 between the clusters 2 are common thereto. In this manner three double and symmetrical vertical circulations of the cooling oil 3 occur in a very efficient manner.

Figure 5:
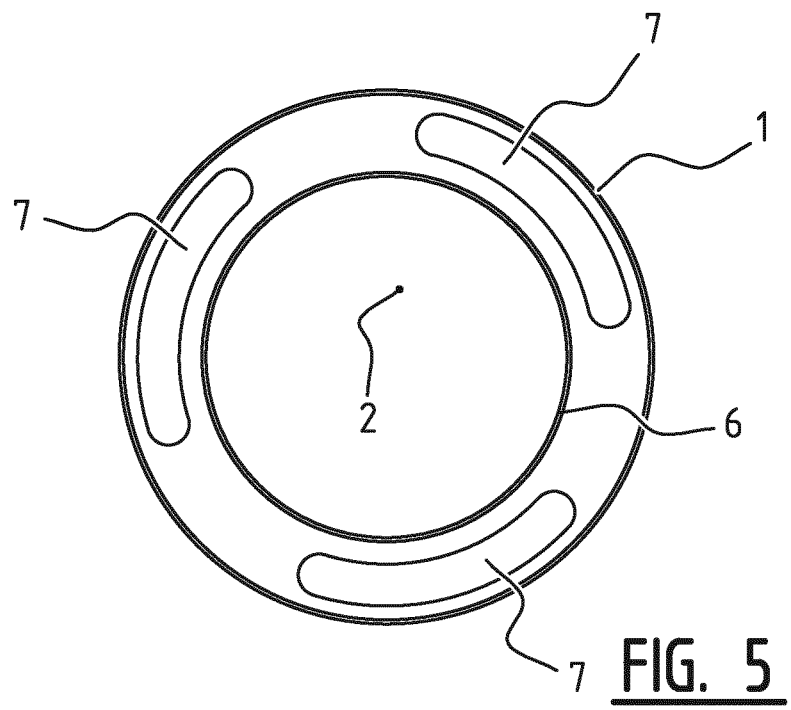
FIG. 5 is a schematic horizontal cross section of another embodiment of a device in accordance with the invention.

FIG. 5 shows another embodiment of the device, wherein the heat generating components 2 are located in the centre of a circular container 1, the vertical separation wall 6 is also circular and extends around the electronic components 2, and the heat exchangers 7 extend in the circular space between the vertical separation wall 6 and the circular container wall 1, all in a concentric configuration. In this manner a concentric vertical circulation of the cooling oil occurs.

Figure 6:
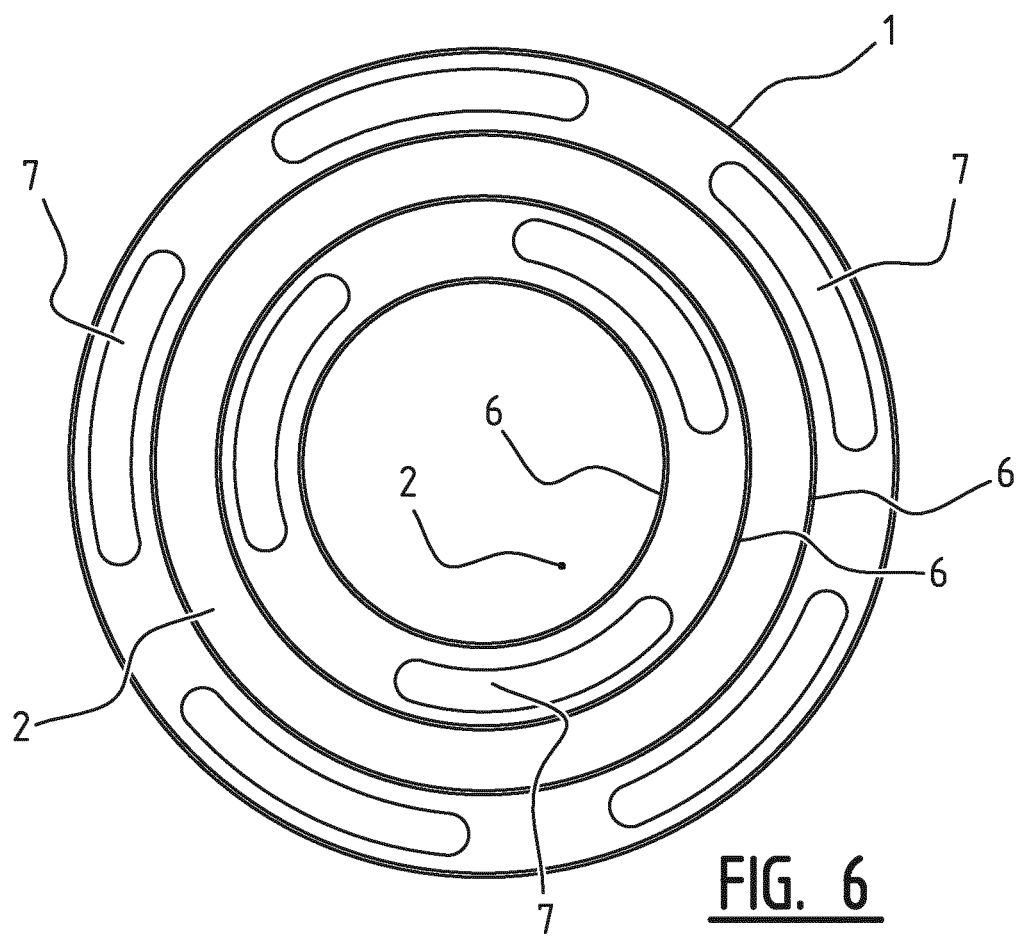
FIG. 6 is a schematic horizontal cross section of another embodiment of a device in accordance with the invention.

FIG. 6 shows a further embodiment wherein features of the embodiments of FIG. 4 and FIG. 5 are combined. Two cluster of electronic components 2 are mounted in the container 1, spaced apart from each other, in a concentric manner. Around the central cluster 2 a first circular vertical separation wall is mounted, and the heat exchangers 7 extend in the circular space between the first vertical separation wall 6 and a second separation wall 6. The second cluster 2 extends in the space around said second vertical separation wall 6 and inside a third vertical separation wall 6. The heat exchangers 7 between the first and second vertical separation walls 6 and between the clusters 2 are common thereto. In this manner two concentric vertical circulations of the cooling oil occur in a very efficient manner.

It will be readily understood that various combinations of the different configurations as shown in the above described embodiments and with different numbers of clusters can be made.

The invention has thus been described by means of preferred embodiments. It is to be understood, however, that this disclosure is merely illustrative. Various details of the structure and function were presented, but changes made therein, to the full extent extended by the general meaning of the terms in which the appended claims are expressed, are understood to be within the principle of the present invention. The description and drawings shall be used to interpret the claims. The claims should not be interpreted as meaning that the extent of the protection sought is to be understood as that defined by the strict, literal meaning of the wording used in the claims, the description and drawings being employed only for the purpose of resolving an ambiguity found in the claims. For the purpose of determining the extent of protection sought by the claims, due account shall be taken of any element which is equivalent to an element specified therein.

The invention claimed is:

1. A device comprising heat producing components, said device comprising:
   a container;
   a liquid in said container in which said heat producing components are submerged for extracting heat from said heat producing components;
   at least one heat exchanger disposed in the container and having a surface which is in contact with said liquid and which is arranged to extract the heat from the liquid and remove the heat from the device;
   a plurality of plate shaped boards disposed in the container in a parallel orientation relative to each other, wherein a surface of each of the plurality of plate shaped boards comprise at least one of the heat producing components disposed thereon; and
   a plurality of vertical walls, wherein at least one of the plurality of vertical walls is disposed between the at least one heat exchanger and the plurality of plate shaped boards, wherein said at least one of the plurality of vertical walls is configured to guide and separate an upward circulation from a downward circulation of the liquid within the container, said upward circulation and said downward circulation is caused by convection due to a temperature difference in the liquid, whereby the liquid rises between the heat producing components and descends along the surface of the at least one heat exchanger,
   wherein the plurality of plate shaped boards define a first plane and wherein the plurality of vertical walls define a second plane, the first plane being perpendicularly orientated relative to the second plane, and
   wherein each of the plurality of plate shaped boards extend from said at least one of the plurality of vertical walls.

2. The device of claim 1, wherein a first space is provided between a lower edge of each of the plurality of vertical walls and a bottom of the container and a second space is provided between an upper edge of each of the plurality of vertical walls and an upper wall of the container, for allowing said liquid circulation to pass.

3. The device of claim 1, wherein said liquid is a dielectric fluid.

4. The device of claim 3 wherein the dielectric fluid is an oil.

5. The device of claim 1, wherein the at least one heat exchanger is a radiator type heat exchanger, having ducts through which a cooling fluid flows.

6. The device of claim 5 wherein the cooling fluid is water or air.

7. The device of claim 1, wherein the at least one heat exchanger is a radiating heat exchanger.

8. The device of claim 1, wherein, as seen in a horizontal cross section of said device, the plurality of plate shaped boards comprising the heat producing components are disposed between at least two of said at least one heat exchanger and at least two of the plurality of vertical walls in a symmetrical configuration.

9. The device of claim 1, wherein the plurality of plate shaped boards are mounted horizontally spaced apart in said container, each of the plurality of plate shaped boards being disposed between at least two of said at least one heat exchangers and between at least two of the plurality of vertical walls, and wherein at least one of the at least two heat exchangers is disposed between at least two of the plurality of vertical walls and the plurality of plate shaped boards.

10. The device of claim 1, wherein said plurality of vertical walls are made of a heat insulating material.

11. The device of claim 1, wherein an inner volume of said container is more than 1000 l.

12. The device of claim 1, wherein a top wall of said container is a removable lid.

13. The device of claim 1, wherein said heat producing components are electronic components.

14. The device of claim 1, wherein, as seen in a horizontal cross section of said device, the plurality of plate shaped boards comprising the heat producing components are disposed between at least two of said at least one heat exchanger and at least two of the plurality of vertical walls.

15. The device of claim 1 wherein the heat producing components comprise at least one server memory board, a hard disk, a processor, and/or a switch.

16. The device of claim 1 wherein said upward circulation and said downward circulation of the liquid within the container is caused only by convection.

* * * * *